United States Patent

Major, Jr. et al.

Patent Number: 5,850,411
Date of Patent: *Dec. 15, 1998

[54] TRANSVERSE ELECTRIC (TE) POLARIZATION MODE ALGAINP/GAAS RED LASER DIODES, ESPECIALLY WITH SELF-PULSATING OPERATION

[75] Inventors: Jo S. Major, Jr.; Randall S. Geels, both of San Jose, Calif.

[73] Assignee: SDL, Inc, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 713,892

[22] Filed: Sep. 17, 1996

[51] Int. Cl.$^6$ .................................................. H01S 3/19
[52] U.S. Cl. .................................. 372/45; 372/46
[58] Field of Search .................... 372/45, 46, 50, 372/27, 43, 44; 437/129

[56] References Cited

U.S. PATENT DOCUMENTS

| | | | |
|---|---|---|---|
| 4,961,197 | 10/1990 | Tanaka et al. | 372/45 |
| 5,003,549 | 3/1991 | Mitsui et al. | 372/46 |
| 5,111,469 | 5/1992 | Narui et al. | 372/46 |
| 5,412,678 | 5/1995 | Treat et al. | 372/45 |
| 5,416,790 | 5/1995 | Yodoshi et al. | 372/46 |
| 5,471,494 | 11/1995 | Mataki et al. | 372/43 |
| 5,523,256 | 6/1996 | Adachi et al. | 437/129 |
| 5,581,570 | 12/1996 | Yoshida et al. | 372/46 |

OTHER PUBLICATIONS

Casey, Jr et al, Heterostructure Lasers: Part B: Materials and Operating Characteristics, New York: Academic Press, 1978, p. 44. (no month available.

*Primary Examiner*—John D. Lee
*Assistant Examiner*—Quyen P. Leung
*Attorney, Agent, or Firm*—W. Douglas Carothers, Jr.

[57] ABSTRACT

An AlGaInP/GaAs laser diode is disclosed in which the active region is made up of quantum wells that are sufficiently thin (less than 5 nm thick) that the transition energy increase due to quantum confinement of the carriers becomes significant. This allows the quantum well material composition to be selected for compressive strain so that the laser operates in the TE polarization mode, while still obtaining a transition energy of from 1.9–2.0 eV for 620–650 nm laser emission. Quantum barriers have sufficient thickness to confine carriers to the quantum wells. Self-pulsation may be obtained in a heterostructure that also includes a saturable absorption layer proximate to the active region and a ridge structure transversely confining absorption produced carriers in the central section of the absorber layer, while allowing lateral carrier diffusion to side regions where carriers are allowed to leave the absorber layer.

30 Claims, 4 Drawing Sheets

TRANSVERSE ELECTRIC (TE) POLARIZATION MODE ALGAINP/GAAS RED LASER DIODES, ESPECIALLY WITH SELF-PULSATING OPERATION

Statement as to Rights to Inventions Made Under Federally-Sponsored Research and Development This invention was made with government support under Contract No. 70NANB2H1241 awarded by the National Institute of Standards and Technology, Department of Commerce. The government has certain rights in the invention.

TECHNICAL FIELD

The present invention relates to semiconductor diode lasers of the AlGaInP/GaAs material system which produce red (620–690 nm) laser emission, and also relates to laser diodes with compressively strained or lattice-matched active regions that operate in a transverse electric (TE) polarization mode. The present invention is especially directed to such laser diodes that have one or more saturable absorbing layers proximate to the laser active region to provide rapidly time-varying absorption of the light generated by the active region so as to exhibit a sustained, high frequency, self-pulsating mode of operation under a constant (dc) bias.

BACKGROUND ART

Semiconductor lasers are commonly used for low power reading operations in optical data storage systems, such as CD-ROM, audio compact disk and video disk systems. For these applications, red (620–690 nm) AlGaInP/GaAs laser diodes are favored over near infrared (780–880 nm) AlGaAs/GaAs laser diodes, because of their shorter wavelength and hence better resolution, although the latter are also sometimes used because of their lower unit price. In addition to such wavelength considerations, laser diode application often favor one particular polarization, either transverse electric (TE) or transverse magnetic (TM), over the other. Moreover, TE mode lasers typically have higher gain, higher output power and higher operating temperatures than TM mode lasers, which may be important factors in certain applications. In light of all of this, it would be advantageous to be able to selectively tailor the semiconductor laser materials to not only produce a particular emission wavelength but also to favor a preferred polarization at that selected wavelength. Unfortunately, for the AlGaInP/GaAs material system it has been found that prior laser diodes of this type operate in the TE polarization mode only for the longer 650–690 nm emission wavelengths and that only the TM polarization mode is available for the shorter 620–650 nm wavelengths. To see why this should be the case, it will be useful to consider the effects of material composition on bandgap energy and strain, and of strain on the emission polarization.

Figure 1:
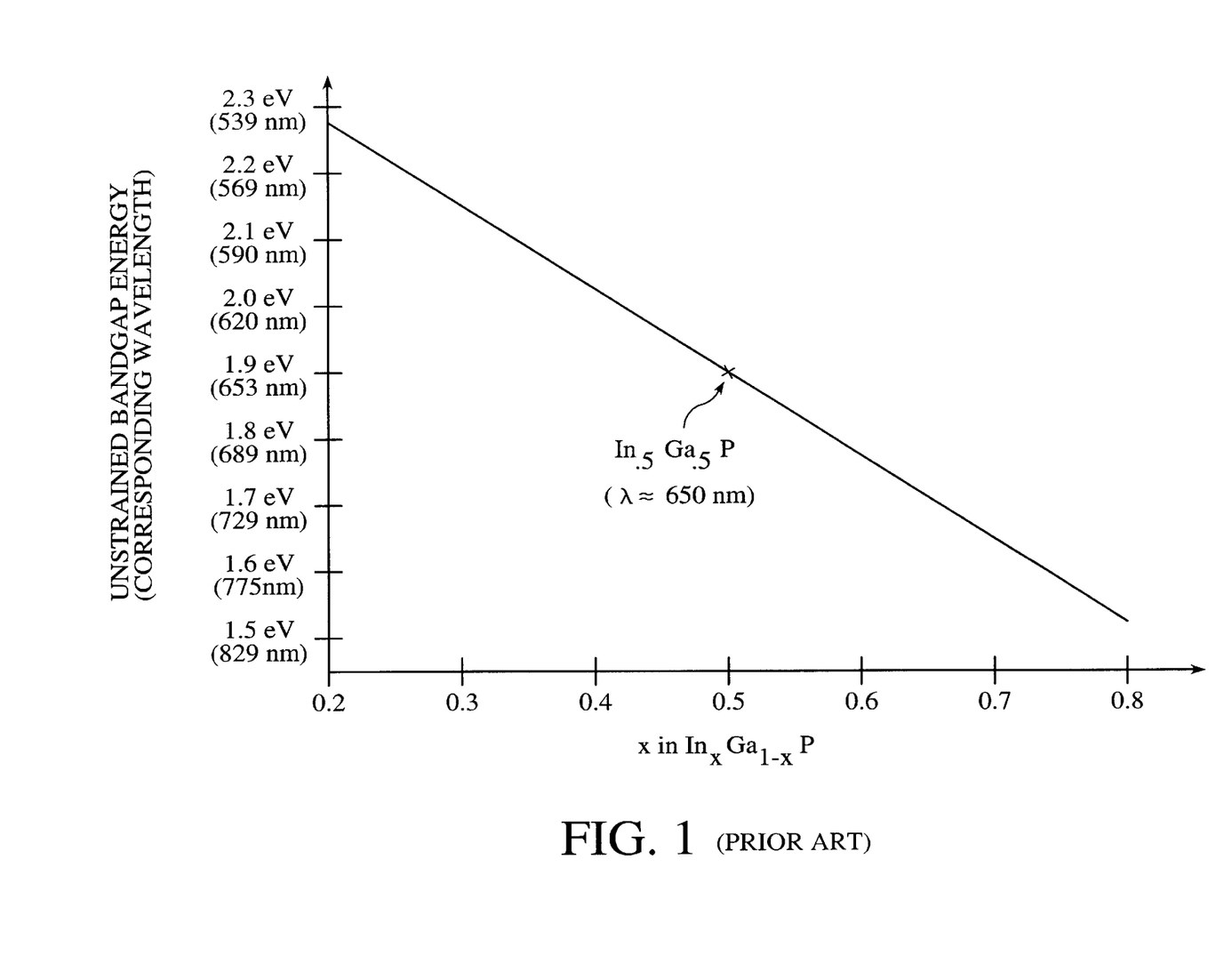
FIG. 1 is a graph of unstrained bandgap energy (in electron volts) and corresponding wavelength (in nanometers) versus the proportion x of indium in the composition $In_xGa_{1-x}P$.

FIG. 1 shows the bandgap energies and corresponding wavelengths for unstrained $In_xGa_{1-x}P$ material in the range from x=0.2 to x=0.8. (The wavelengths are derived from the relationship $E_g=hc/\lambda$, where $E_g$ is the bandgap energy, h is Planck's constant, c is the speed of light in vacuo, and $\lambda$ is the wavelength, and thus assumes that substantially all of emitted photon energy is contributed by the bandgap energy.) It can be seen from FIG. 1 that the alloy composition $In_{0.5}Ga_{0.5}P$ has a bandgap of about 1.9 eV and emits light at about 650 nm. In order to produce laser light emission with a longer wavelength than 650 nm, one can decrease the bandgap of the active lasing material by changing its composition, for example by increasing the proportion of indium. Thus, $In_{0.58}Ga_{0.42}P$ has a bandgap of about 1.8 eV and a corresponding emission wavelength of about 690 nm. Likewise, in order to produce a wavelength shorter than 650 nm, one can change the composition of the material to increase its bandgap. While this could be done by adding aluminum to the composition, as is done with quantum barriers and cladding layers in the laser diode heterostructure, in order to provide sufficient carrier confinement for room temperature CW operation, the bandgap increase for the quantum wells is normally obtained by decreasing the proportion of indium in the composition. For example, $In_{0.42}Ga_{0.58}P$ has a bandgap of about 2.0 eV and a corresponding wavelength of about 620 nm.

Figure 2:
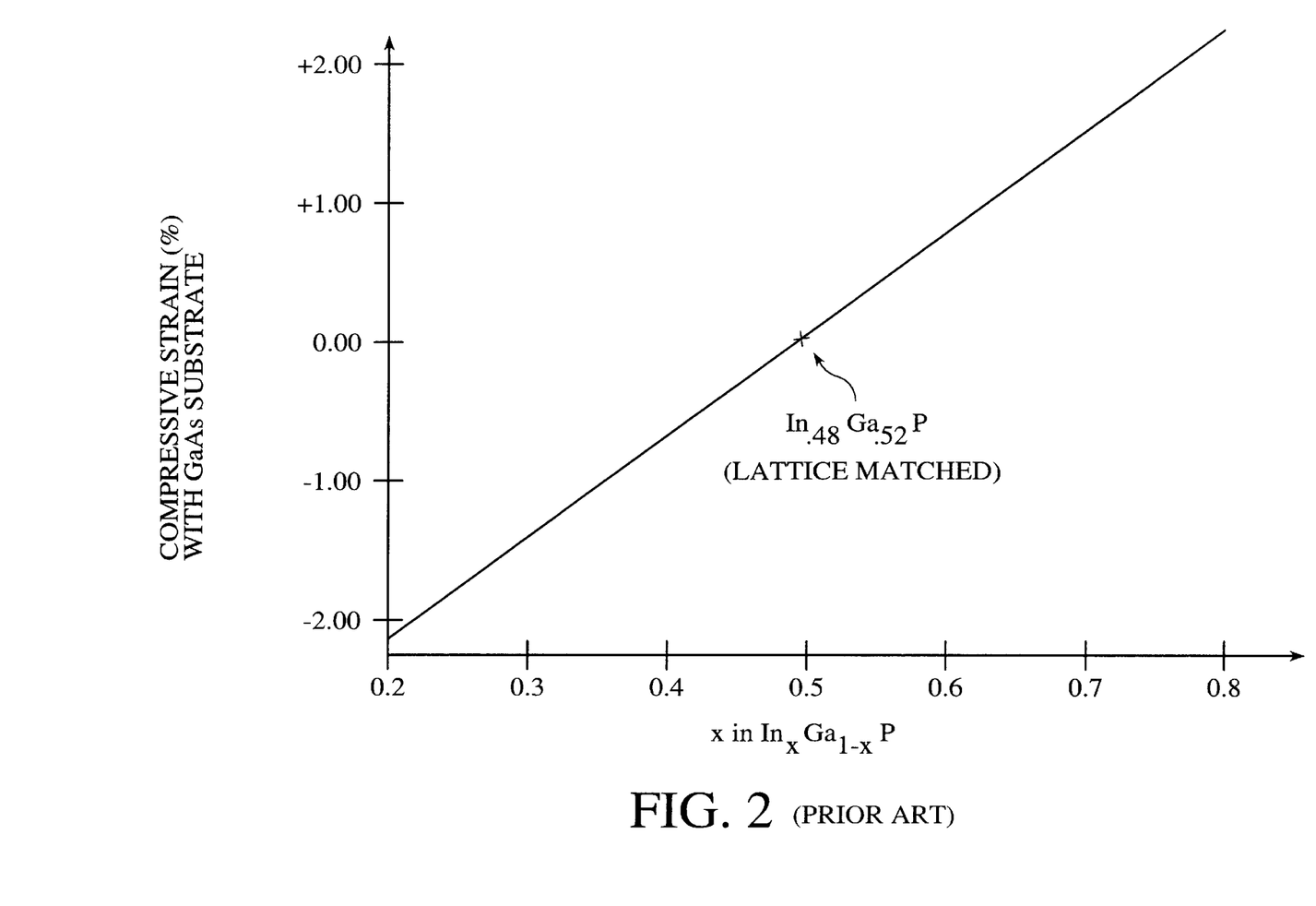
FIG. 2 is a graph of compressive strain (in percentage) versus the proportion x of indium in an $In_xGa_{1-x}P$ layer on a GaAs substrate.

FIG. 2 shows the amount of strain for various compositions of $In_xGa_{1-x}P$ layers on a GaAs substrate. The material is lattice-matched to the substrate for x≈0.48. Increasing the proportion of indium results in a larger crystal lattice so that the material is under compressive strain. For example, when x≈0.62, the alloy composition is under about 1.0% compressive strain. Likewise, decreasing the proportion of indium produces a smaller lattice size and tensile strain. Thus, when x≈0.35, the composition experiences −1.0% compressive strain (i.e., +1.0% tensile strain). Replacing part of the gallium with aluminum has only a negligible effect on strain. For useful lifetimes, a maximum strain in the active region's quantum wells and barriers of about 2% (i.e., compositions where $0.2 \leq x \leq 0.8$) is a practical limit for most devices. The critical limit for strain depends on the thickness of the strained layers. Thus, the cladding layers and other relatively thick layers outside of the active region require significantly less strain and may need to be substantially lattice-matched to the substrate to avoid dislocations and other lattice defects. One can see from a comparison of FIGS. 1 and 2, that compositions providing bandgaps less than 1.9 eV and corresponding emission wavelengths longer than 650 nm are under compressive strain, while compositions providing bandgaps greater than about 1.9 eV and corresponding wavelengths shorter than 650 nm are under tensile strain.

For GaInP lattice-matched to a GaAs substrate, the bandstructure has "light" hole and "heavy" hole valence bands that are degenerate at k=0 (where k is the wavenumber of carriers in the lattice). There is an energy gap $E_g$ between these valence bands and the conduction band. TE polarized light is emitted when an excited electron in the conduction band recombines with a hole in the heavy hole valence band, whereas TM polarized light is emitted when an electron combines with a light hole. Because the differential gain of the TE mode is larger than that of the TM mode, a laser mode with a lattice-matched InGaP active region will generally lase in the TE mode. An $In_xGa_{1-x}P$ layer with x<0.48 will be under tensile strain and will emit TM polarized light. However, a compressively strained layer (x>0.48) will emit TE polarized light due to the dominance of the heavy hole band. Prior laser diodes emitting at the shorter 620–650 nm wavelengths have tensile strained quantum wells and thus operate in the TM mode, while those emitting at the longer 650–690 nm wavelengths are compressively strained and operate in the TE mode.

When reading stored data from optical disks, a very low random intensity noise (RIN) level from the laser illumination source is needed for a good signal-to-noise ratio at the detector. However, in such data storage systems, external reflective feedback typically occurs, in which some fraction of the emitted laser light is coupled back into the laser diode. The phase of this feedback varies in time due to vibrations in the system, other slight, but essentially random, movements of various system components, and the reading of phase-encoded data stored on some types of disks. These phase variations in the feedback cause modal instabilities in the laser cavity, resulting in random fluctuations (i.e., noise) in the laser's output power.

Although this feedback sensitivity of the laser is also dependent to some extent upon the amplitude of the optical feedback, such that the noise in the emitted output of the laser could be reduced by using an optical design that minimizes the amount of reflected light coupling back into the laser, such a design normally requires completely separate illumination and collection optics, thereby leading to a much larger and heavier (and hence mechanically slower) read head containing such optics.

Another way to reduce the feedback sensitivity of a laser diode is to modulate the laser at high speed. The high speed modulation renders the laser insensitive to feedback by destroying phase coherence between the reflected beam and the oscillating modes of the laser. Typically, the modulation rate needed for this purpose is on the order of several hundred megahertz. Unfortunately, the additional circuitry needed to bias and modulate the laser diode at high frequency considerably complicates the overall system and makes it much more expensive.

A better solution is to provide a laser diode that inherently self-pulsates, emitting a high frequency stream of successive optical pulses when driven by a DC (unmodulated) bias. Self-pulsating laser diodes have been demonstrated, as illustrated for example in U.S. Pat. Nos. 4,961,197 (Tanaka et al.); 5,003,549 (Mitsui et al.); 5,111,469 (Narui et al.); and 5,416,790 (Yodoshi et al.). Most of these prior self-pulsating lasers are of the near-infrared AlGaAs-type. Those of the AlGaInP-type are characterized by the same wavelength-polarization constraints imposed by strain as their non-pulsating counterparts.

The self-pulsating laser diodes usually achieve their rapid pulsation operation by incorporating a saturable absorbing layer into the laser structure. This absorbing layer is positioned outside of the active region, but close enough to the active region that it overlaps the propagating optical mode. The active region itself can be a single active layer (typ., ≈50 to 150 nm thick), a single quantum well (SQW) structure (typ. well ≈10 to 30 nm thick), a multiple quantum well (MQW) structure (typ. 2 to 4 wells, each ≈5 to 20 nm thick), or a superlattice structure (effective thickness ≈15 to 30 nm). The saturable absorbing layer in the neighborhood of the active region is composed of a material (such as GaInP) and has a thickness (e.g., it may form a 10 to 40 nm thick quantum well) having an effective bandgap energy that is smaller than (or at most substantially equal to) the energy corresponding to the lasing wavelength, thereby giving the absorbing layer a high intrinsic absorption coefficient at the lasing wavelength. Accordingly, when the laser diode is first energized, the absorbing layer initially absorbs the light generated in the active region quite strongly, so that the photon density in the active region is kept at a level below the lasing threshold and the density of excited electron-hole pairs in the active region is allowed to build. Carriers generated in the absorbing layer due to the absorption of light from the active region are confined there by the higher bandgap energy of adjacent cladding layer material (such as AlInP) both above and below the absorbing layer. The resulting collection of carriers in the absorbing layer causes a drop in its absorption coefficient as the absorbing layer saturates, thereby reducing the loss in the laser cavity and allowing the sudden onset of strong lasing as the photon density in the active region rises above the threshold level. The intense lasing mode rapidly depletes the carriers in the active region, so the device quickly stops lasing again. The cladding material above the absorbing layer typically has a ridge structure with lower bandgap material (such as GaAs) regrown on each side of the central ridge. Carriers confined in the absorbing layer by the cladding layer below and the ridge above are still free to diffuse laterally within the absorbing layer until they reach the areas on each side of the ridge structure, where they can fall out of the absorbing layer into the surrounding lower bandgap material. The absorbing layer can thus be quickly emptied of the accumulated carriers by means of diffusion once lasing has stopped, so as to restore the absorption coefficient to its original peak value and again become a strong absorber of light generated by the active region. Hence, the cycle starts all over again. The modulation rate attained in such self-pulsating devices is typically several hundred megahertz, but can be as high as several gigahertz, which is more than enough to reduce the laser's feedback sensitivity and obtain very low RIN emission.

It is an object of the invention to provide AlGaInP/GaAs laser diodes that operate in the TE polarization mode for 620–650 nm emission wavelengths.

It is another object of the present invention to provide such TE mode laser diodes with self-pulsating operation.

DISCLOSURE OF THE INVENTION

The above objects are met by a laser diode having an active region in which the effective bandgap energy (i.e., transition energy) of its quantum well(s) is increased by means of quantum confinement of the carriers within narrower (i.e., thinner) wells. To obtain an effective bandgap energy of at least 1.9 eV so as to generate 620–650 nm wavelength laser light, the GaInP or AlGaInP quantum wells have a thickness of not more than 5 nm, and preferably about 3 to 4 nm, compared to the 5 to 20 nm (usually 6 to 10 nm) thick wells of multiple quantum well active regions in prior laser diodes. The carrier confinement or quantum barrier layers bounding the quantum wells have a higher bandgap energy than the wells and sufficient thickness to confine carriers within the wells (unlike superlattices). The barriers' higher bandgap can be achieved by compositional differences (increased aluminum and/or decreased indium content) relative to the quantum well composition. For adequate carrier confinement within the quantum wells, the barrier layers must be at least 2 nm thick and are typically 5 to 10 nm thick.

Because the increased effective bandgap energy of the quantum wells is obtained primarily through a decrease in well thickness to the point at which the contribution to the carrier energy states from quantum confinement of the carriers becomes significant, the material composition of the quantum wells can be selected to minimize or eliminate tensile strain of the quantum wells, and thereby achieve a TE mode of laser operation.

As a result of the increased quantum confinement energy and elimination of tensile strain in the active region's quantum wells, self-pulsating laser diodes with 620–650 nm wavelength, TE emission are obtained with significantly increased output power, and with self-pulsation operation up to higher operating temperatures compared to prior self-pulsating laser diodes in this wavelength range.

BEST MODE OF CARRYING OUT THE INVENTION

Figure 3A:
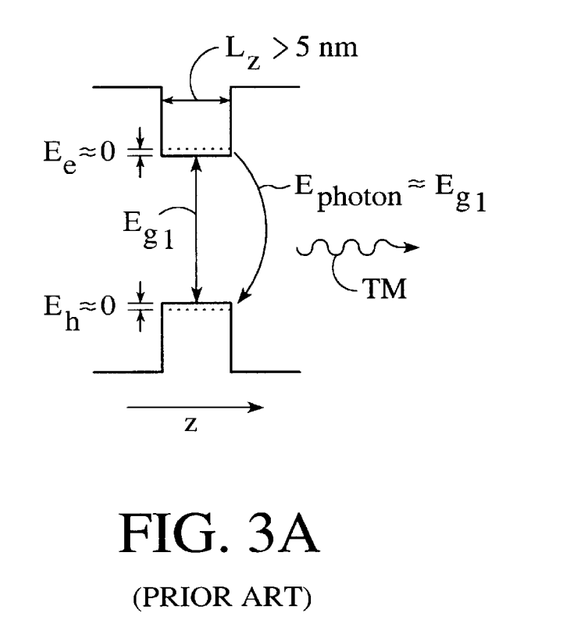
FIGS. 3A and 3B are quantum well bandgap diagrams respectively for a tensile-strained, high intrinsic bandgap InGaP, normal width quantum well of the prior art with negligible confinement energies and for a compressive-strained, lower intrinsic bandgap InGaP, narrow quantum well of the present invention exhibiting high quantum confinement energies, where both configurations have identical photon energies.
Figure 3B:
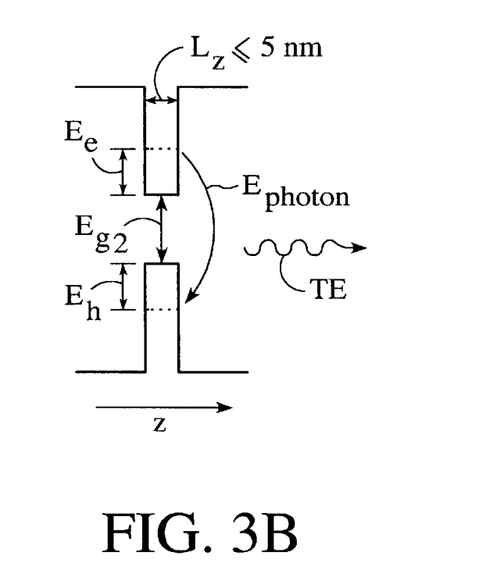

With reference to FIGS. 1 and 2, it has been seen that due to the constraints imposed by material composition, bandgap energy, lattice size and strain, prior laser diode devices of the AlGaInP/GaAs material type are limited to TM mode operation in the shorter 620–650 nm wavelength range. FIGS. 3A and 3B show how quantum confinement in narrow quantum wells is used in the present invention to simultaneously provide both compressive strain and high effective bandgap energies in the quantum wells to produce TE mode operation for wavelengths shorter than 650 nm. (For illustration purposes, the energy diagrams are not strictly to scale.) By cladding lower bandgap quantum well material between higher bandgap quantum barrier material, confinement of electronic carriers in the quantum well or wells is achieved. The quantum confinement in the wells allows discrete energy states for the carriers in which the carrier confinement energies are:

$$E_n = \frac{(n\pi h)^2}{2mL_z^2} \quad (1)$$

where m is the effective mass of the particular carriers under consideration (i.e., conduction electrons, and light or heavy holes), $L_z$ is the quantum well thickness, h is Planck's constant divided by $2\pi$, and n is a positive integer (1, 2, 3, ...). Note that most of the carriers are in the confinement ground state (n=1) of their respective bands. When a conduction electron recombines with a hole in the valence band, the effective bandgap energy, i.e. the transition energy or emitted photon energy is:

$$E_{photon} \approx E_g + E_e + E_h, \quad (2)$$

where $E_g$ is the intrinsic bandgap of non-confined quantum well material (including the contribution due to any strain), $E_e$ is the electron confinement energy and $E_h$ is the hole confinement energy. (Note that the above equation is exact only for infinite energy confinement barriers but is sufficiently close to be a useful approximation for this technical discussion.)

In prior AlGaInP laser diodes, the quantum wells are broad, i.e. have a well thickness $L_z$ greater than 5 nm and which may be as much as 20 or 30 nm thick. At such quantum well thicknesses, since the confinement energies are inversely proportional to the square of the thickness $L_z$ (as seen from equation (1) above), the electron and hole confinement energies $E_e$ and $E_h$ are small and substantially all of the photon energy is contributed by the intrinsic material bandgap $E_g$ of the quantum well. This situation is represented by the diagram shown in FIG. 3A. There the energy versus depth z in the vicinity of a quantum well is shown for the conduction band and for the principal valence band (here, the heavy hole band). The thickness $L_z$ of the quantum well material is greater than 5 nm. The quantum well is surrounded by the higher bandgap material of adjacent carrier confinement layers, such as quantum barriers. The solid upper line represents the energy of the conduction band, the solid lower line represents the energy of the valence band, and the corresponding dashed lines represent the confined electron and hole ground states within the quantum well, respectively. It is seen that the electron and hole confinement energies $E_e$ and $E_h$ are small, and that the photon energy $E_{photon}$ is substantially equal to the intrinsic material bandgap $E_{g1}$ in the quantum well. Thus, in order to achieve the high photon energies (>1.9 eV) needed to provide 620–650 nm wavelength emission, it is necessary that the quantum well material have a high bandgap. As seen previously, the constraints in the AlGaInP/GaAs material system results in tensile strain in the quantum well and TM polarization mode emission.

By comparison, laser diodes of the present invention have extremely thin quantum wells with a thickness $L_z$ of at most 5 nm, and preferably about 3 to 4 nm. By selecting such very small well thicknesses, the quantum confinement energies $E_e$ and $E_h$ become significant and are typically on the order of about a tenth of an electron volt, i.e., about 5% of the total energy $E_{photon}$. This situation is represented by the energy diagram of FIG. 3B. There, a very thin quantum well ($L_z \leq 5nm$) has relatively large confinement energies $E_e$ and $E_h$ for the confined electron and hole ground states (dashed lines). The photon energy $E_{photon}$ can be relatively large (i.e., about 1.9 to 2.0 eV) for an emission wavelength less than 650 nm, while using quantum well material with much smaller intrinsic bandgap energy $E_{g2}$ (i.e., about 1.8 to 1.9 eV). Accordingly, quantum wells can be compressively strained to produce TE polarization mode photon emission. Note that the same photon energy $E_{photon}$ can be produced in both cases illustrated in FIGS. 3A and 3B, one with high intrinsic bandgap, but tensilely strained, normal thickness quantum wells of the prior art, the other with low intrinsic bandgap, compressively strained, very thin quantum wells of the present invention. The present invention takes advantage of the high carrier confinement energies of very thin quantum wells to allow compressively strained quantum well material to be used, thus achieving TE mode emission for wavelengths of from about 620 nm to 650 nm.

Figure 4:
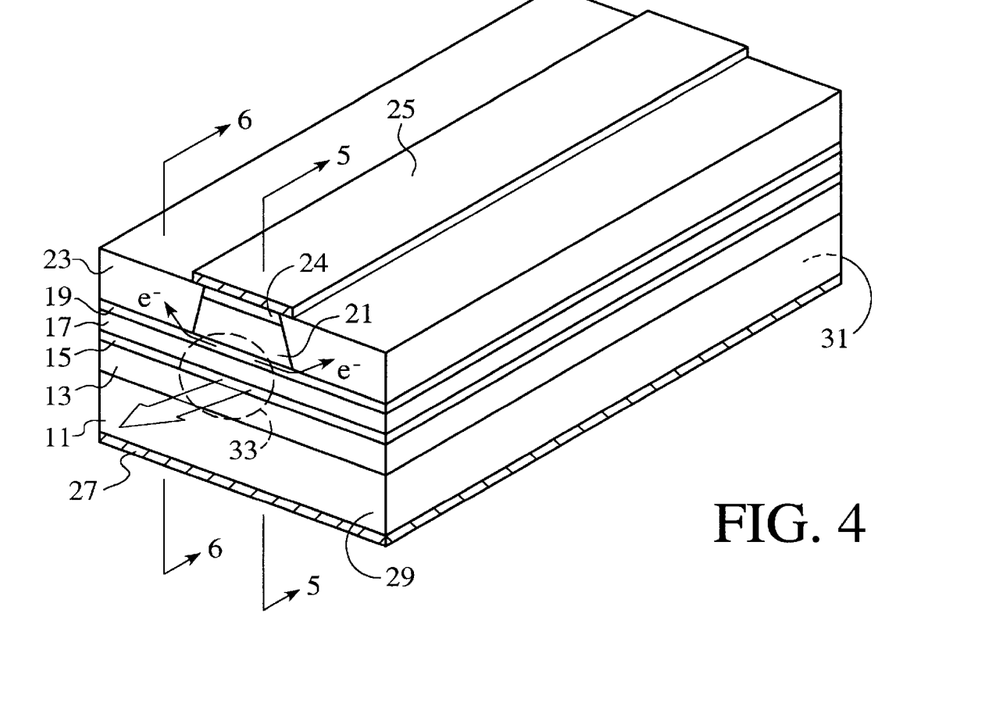
FIG. 4 is a perspective view of a self-pulsating laser diode structure in accord with the present invention.

One laser diode structure in which TE mode operation is advantageous is a self-pulsating laser, such as those used in low power reading operations in optical data storage systems. TE mode devices tend to have higher gain and self-pulsate to higher operating temperatures than their TM mode counterparts. The present invention allows TE mode self-pulsation to be extended to wavelengths less than 650 nm. A self-pulsating laser diode of the present invention is seen in FIG. 4. The laser includes a semiconductor diode heterostructure disposed over an n-type GaAs substrate 11. In particular, the device shown in FIG. 4 includes an n-type $(Al_sGa_{1-s})_{1-t}In_tP$ cladding layer 13 formed over the substrate 11, where $0.7 \leq s \leq 1.0$ and t is about 0.5. Preferably, cladding layer 13 is $Al_{0.5}In_{0.5}P$. It is typically about 0.5 to 2.0 μm thick.

A multiple quantum well active region 15 is disposed on the cladding layer 13. It typically includes 2 to 4 quantum wells, each 3 to 5 nm thick, alternating with 3 to 5 quantum barriers, each 5 to 10 nm thick. The quantum wells are composed of $(Al_xGa_{1-x})_{1-y}In_yP$, where $0 \leq x \leq 0.3$ and $0.5 \leq y \leq 0.8$. Preferably x=0, so that the preferred quantum well material is $Ga_{1-y}In_yP$. The quantum barriers are composed of $(Al_uGa_{1-u})_{1-v}In_vP$, where $0.3 \leq u \leq 0.7$ and $0.4 \leq v \leq 0.6$. The quantum barriers need to have a bandgap energy higher than desired photon energy or effective bandgap of the quantum wells, and must also have a thickness of at least 2 nm in order to effectively confine the carriers within the quantum wells. The barriers themselves need not be exactly lattice matched to either the substrate or the quantum wells, provided the strain is not more than about 1%. In fact, a smaller lattice size for the quantum barriers relative to the substrate (i.e. $0.4 \leq v \leq 0.48$) may be preferred, as it would tend to lead to a strain-balanced structure, enhancing lattice stability.

A p-type $(Al_{s\ I\ Ga1-s})_{1-t}In_tP$ cladding layer 17 is disposed on the active region 15. Again, $0.7 \leq s \leq 1.0$ and t is about 0.5. Cladding layers 13 and 17 may have identical compositions, although this is not essential. The p-type cladding layer 17 has a thickness of from 0.05 to 0.2 μm. This thickness is somewhat critical for self-pulsation, as it determines the degree of optical overlap of the optical mode propagating along the active region 15 with the saturable absorber layer 19 disposed on top of the cladding layer 17 along the length of the active region 15. The saturable absorber 19 has a lower bandgap energy than the photon energy and is typically composed of $In_zGa_{1-z}P$, where $0.5 \leq z \leq 0.7$ and $z \leq y$. (Recall that y represents the indium content in the active region quantum well material.) The saturable absorber layer 19 could be a quantum well of from 5 to 20 nm thickness. A p-type ridge layer or mesa 21 is disposed over the saturable absorber 19 as a central stripe extending the length of the laser cavity. The ridge layer or mesa 21 is approximately 1 μm thick and is typically composed of the same $(Al_sGa_{1-s})_{1-t}In_tP$ material as the claddings 13 and 17, where $0.7 \leq s \leq 1.0$ and t is about 0.5. An $Al_{0.5}In_{0.5}P$ mesa 21 is preferred. Because of their thicknesses, layers 13, 17 and 21 should all lattice match with the substrate for long device lifetimes. An 0.1μm thick $p^+$-doped GaAs contact layer or cap 24 is disposed over the central ridge or mesa 21 to form a low resistance contact surface for a conductive contact stripe 25. Also disposed on the saturable absorber layer 19 on both sides of the central ridge 21 is low bandgap n-GaAs material 23. It has a thickness of about 1.1 μm so as to usually be level with the top of the contact layer 24.

The laser includes conductive contacts 25 and 27 forming electrodes for applying a forward bias voltage to the diode heterostructure so as to inject charge carriers into quantum well active region 15 and thereby excite the device to cause laser light generation in the quantum wells. Contact 25 is formed as a central stripe above the mesa and cap layers 21 and 24 extending the length of the active region. Second contact 27 is formed beneath the substrate 11. The n-type GaAs material 23 functions in part to confine carrier injection to the central portion of the active region coinciding with the mesa or ridge layer 21.

The structure is cleaved to form front and rear reflective facets 29 and 31 defining the laser cavity. The facets 29 and 31 may be coated for high reflection to lower cavity losses at the facets, so as to form a higher Q cavity in which peak saturable absorber losses in layer 19 dominate all other cavity losses. Preferably, the front and rear reflection product $R_F \cdot R_R$ is at least 0.5. Alternatively, the feedback defining the laser cavity can be provided by one or more grating reflectors, as in a DBR or DFB laser. Further, the active region 15 generating laser light in the cavity can have a greater length of at least 500 μm to increase the overall gain in the cavity for strong lasing once saturation of layer 19 occurs. The additional length of the laser cavity also enhances the effect of the saturable absorber when compared to other losses in the laser.

Figure 5:
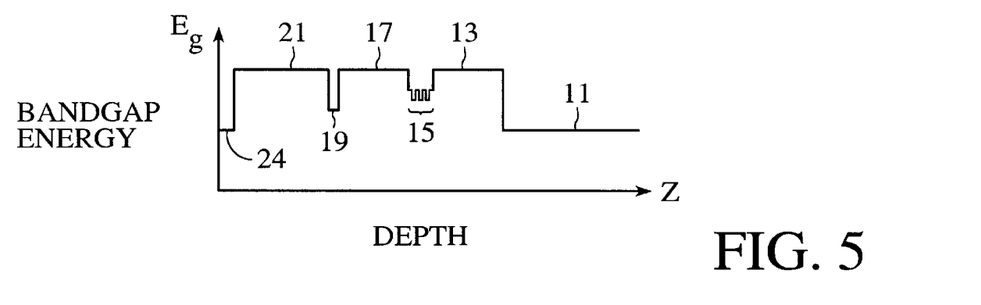
FIGS. 5 and 6 are graphs of bandgap energy versus depth from the top surface of the laser diode structure taken along the lines 5—5 and 6—6, respectively, in FIG. 4.
Figure 6:
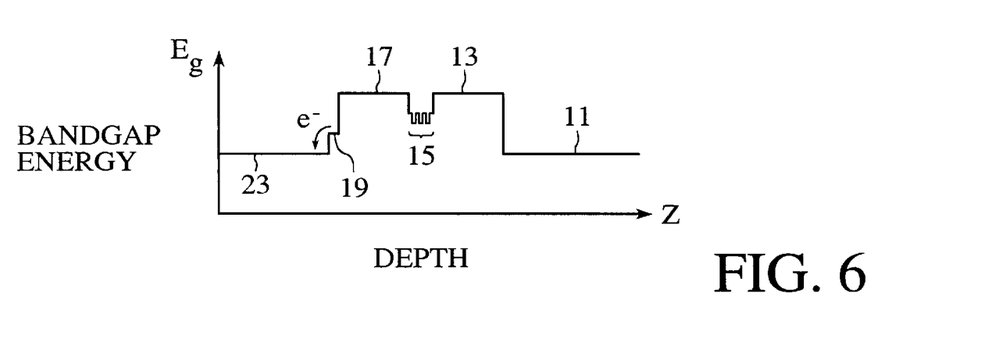

FIG. 5 shows relative bandgap energies versus depth for the central portion of the heterostructure that includes ridge layer 21, while FIG. 6 shows relative bandgap energies versus depth for the edge portions of the heterostructure on both sides of the ridge layer 21. The GaAs substrate 11, side regions 23 and contact layer 24 have a bandgap of about 1.4 eV. The quantum wells in the active region 15 have an intrinsic material bandgap of about 1.8 to 1.9 eV, but together with the quantum confinement energies of the carriers has an effective bandgap of about 1.9 to 2.0 eV. The quantum barriers in the active region 15 has a bandgap greater than the effective bandgap of the quantum wells, typically about 2.0 eV. Cladding layers 13 and 17 and the ridge layer or mesa 21 have a bandgap of about 2.1 eV. The saturable absorbing layer 19 has a lower bandgap than the effective bandgap of the quantum wells, typically about 1.8 eV.

The quantum barriers have a higher effective bandgap energy than the quantum wells and have a thickness sufficient to confine carriers within the wells. In particular, barrier thickness should be at least 2 nm, and is preferably about 5–10 nm. This differs from superlattices in which carrier quantum wave functions leak through 1 nm thick "barriers" and spread out over the entire superlattice. There the carriers are not really confined to the "well" layers but leak through the so-called "barrier" layers to adjacent "wells". Superlattices behave like a single 15–30 nm active layer rather than as a group of distinct coupled quantum wells. In the present invention, carriers are sufficiently confined by the thicker real quantum barriers to form a multiple quantum well structure. This confinement is essential to obtain the desired transition energy increase above that of the intrinsic material bandgap.

In operation, the saturable absorbing layer 19, which is spaced close enough to the active region 15, typically about 0.05–0.2 μm from the active region 15, so that the optical mode generated by the active region (indicated by the dashed area 33) overlaps the saturable absorbing layer 19, and has a high intrinsic absorption coefficient for the 620–650 nm wavelength light generated by the active region 15 due to its lower bandgap energy. However, as the layer 19 saturates with absorption generated carriers, which are confined by the higher bandgap cladding and ridge layers 17 and 21, the absorption by the layer 19 drops, allowing the device to lase. The carriers in the absorption layer diffuse laterally to regions on both sides of the ridge 21, where they are no longer confined by the ridge material and can fall into lower bandgap layer 23 in these side regions, as illustrated by the movement of the electron carriers $e^{31}$ shown in FIGS. 4 and 6. Even though a constant DC forward bias is applied to the diode heterostructure by the electrodes 25 and 27 for constant pumping of the laser active region 15, the laser rapidly cycles between non-lasing and lasing operation at a frequency in excess of 100 MHz as the saturable absorber layer 19 cycles between an absorptive and saturated (nonabsorptive) condition, and the electrical pump energy is alternately stored as excited carriers in the quantum wells and released into the optical lasing mode.

We claim:

1. A semiconductor laser, comprising
    a semiconductor heterostructure disposed over a GaAs substrate, the heterostructure including an active region with a plurality of quantum wells having an $(Al_xGa_{1-x})_{1-y}In_yP$ material composition under compressive strain and bounded by carrier confinement layers, said quantum wells providing for higher carrier confinement energies, $E_e$ and $E_h$, with relatively large photon energy, $E_{photon}$, with an intrinsic bandgap energy, $E_g$, thereof smaller than the photon energy, $E_{photon}$, ($E_{photon} > E_g$) the combination of said quantum wells being compressively strained and having a thickness of not more than 5 nm permitting attainment of TE mode emission for wavelengths less than 650 nm; and self-pulsation means, including a saturable absorber layer integrated into said semiconductor heterostructure proximate to said quantum well active region, for providing time-varying absorption at a frequency in excess of 100 MHz of said light generated by said active region to induce laser emission of a quasi-cw stream of successive optical pulses at said absorption variation frequency.

2. The semiconductor laser of claim 1 wherein said quantum well thickness is in a range from 3 to 4 nm.

3. The semiconductor laser of claim 1 wherein said carrier confinement layers bounding said at least one quantum well include quantum barriers having a thickness of at least 2 nm and a higher bandgap energy than said quantum well.

4. The semiconductor laser of claim 3 wherein said quantum barriers have a thickness in a range from 5 to 10 nm.

5. The semiconductor laser of claim 3 wherein said quantum barriers are composed of $(Al_uGa_{1-u})_{1-v}In_vP$, where $0.3 \leq u \leq 0.7$ and $0.4 \leq v \leq 0.6$.

6. The semiconductor laser of claim 1 wherein said quantum wells are composed of $(Al_xGa_{1-x})_{1-y}In_yP$ where $0 \leq x \leq 0.3$ and $0.5 \leq y \leq 0.8$.

7. The semiconductor laser of claim 1 wherein said carrier confinement layers include cladding layers bounding said quantum well active region, said cladding layers being composed of $(Al_sGa_{1-s})_{1-t}In_tP$, where $0.7 \leq s \leq 1.0$ and t is about 0.5.

8. The semiconductor laser of claim 1 wherein said saturable absorber layer has a lower bandgap energy than the energy associated with the light generated by the active region, and wherein said saturable absorber layer is positioned sufficiently close to the active region so as to overlap the optical mode of light generated by and propagating along the active region in the laser cavity.

9. The semiconductor laser of claim 8 wherein said saturable absorber layer is composed of $In_zGa_{1-z}P$ material, where $0.5 \leq z \leq 0.7$ and where $z \leq y$, y representing the indium content of said active region quantum well material.

10. The semiconductor laser of claim 8 wherein said saturable absorber layer is a quantum well with a thickness in a range from 5 to 20 nm.

11. The semiconductor laser of claim 8 wherein said saturable absorber layer is separated from said active region by a higher bandgap cladding layer that is from 0.05 to 0.2 $\mu$m thick.

12. The semiconductor laser of claim 1 wherein said self-pulsation means further includes a ridge layer formed as a central stripe extending the length of said active region and disposed over said saturable absorber layer, said ridge layer having a higher bandgap energy than said saturable absorber layer for transversely confining absorption generated carriers thereto, lower bandgap material being disposed over said saturable absorber layer on both sides of said central ridge layer, allowing said absorption generated carriers to leave said saturable absorber layer into said lower bandgap material after diffusing laterally within said saturable absorber layer.

13. The semiconductor laser of claim 12 wherein said ridge layer is composed of $(Al_sGa_{1-s})_{1-t}In_tP$, where $0.7 \leq s \leq 1.0$ and t is about 0.5.

14. The semiconductor laser of claim 12 wherein said lower bandgap material on both sides of said ridge layer is GaAs.

15. The semiconductor laser of claim 1 wherein said excitation means comprises electrode means applying a constant dc forward bias to said semiconductor heterostructure to inject charge carriers into said at least one quantum well of said active region at a substantially constant rate.

16. The semiconductor laser of claim 1 wherein said active region generating laser light in said cavity has a length of at least 500 $\mu$m.

17. The semiconductor laser of claim 1 wherein said laser-cavity-defining optical feedback means has a front and rear reflection product $(R_F \cdot R_R)$ of at least 0.5.

18. A semiconductor laser, comprising:

a semiconductor heterostructure including at least $(Al_xGa_{1-x})_{1-y}In_yP$ material layers substantially lattice matched to a Gads substrate, where $0 \leq x \leq 1$ and $0.4 \leq y \leq 0.8$, the heterostructure including a quantum well active region having at least one quantum well having a thickness of at most 5 nm providing an effective bandgap energy, $E_{photon}$, of at least 1.9 eV so as to generate light in an about 620 nm to 650 nm wavelength range, said quantum well active region having quantum barriers therein of at least 2 nm thickness to provide carrier confinement within said at least one quantum well, said effective bandgap energy, $E_{photon}$, of at least 1.9 eV is achieved by a combination of quantum confinement of carriers in said at least one quantum well of at most 5 nm thickness and the composition of said quantum well being selected with $y \geq 0.48$ such that compressive strain is provided relative to said at least one quantum well to induce a TE polarization mode of laser light generation in said 620 to 650 am wavelength range, excitation means for pumping said semiconductor heterostructure to introduce charge carriers at a substantially constant rate into said at least one quantum well of said active region so as to cause said laser light generation by said active region, optical feedback means for defining a resonant laser cavity containing said active region, and self-pulsation means, including a saturable absorber integrated into said semiconductor heterostructure proximate to said quantum well active region, for providing time-varying absorption at a frequency in excess of 100 MHz of said light generated by said active region to induce laser emission of a quasi-cw stream of successive optical pulses at said absorption variation frequency.

19. The semiconductor laser of claim 18 wherein said active region has multiple quantum wells, all being of at most 5 nm thickness.

20. The semiconductor laser of claim 18 wherein said at least one quantum well has a thickness of 3 to 4 nm.

21. The semiconductor laser of claim 18 wherein said quantum barriers have a thickness of 5 to 10 nm.

22. The semiconductor laser of claim 18 wherein said laser cavity defining optical feedback means comprises mirror facets integrally formed at opposite ends of said semiconductor heterostructure.

23. The semiconductor laser of claim 18 wherein said laser cavity defining optical feedback means includes at least one grating reflector.

24. The semiconductor laser of claim 18 wherein said laser cavity defining optical feedback means has a front and rear reflection product ($R_F \cdot R_R$) of at least 0.5.

25. The semiconductor laser of claim 18 wherein said active region generating laser light in said cavity has a length of at least 500 µm.

26. The semiconductor laser of claim 18 wherein said excitation means comprises electrode means for applying a constant dc forward bias to said semiconductor heterostructure.

27. The semiconductor laser of claim 18 wherein said saturable absorber comprises a layer with a lower bandgap energy than the energy corresponding to the light generated by the active region, said saturable absorber layer positioned outside of but proximate to the active region such that said saturable absorber layer overlaps the optical mode of said light generated by and propagating along the active region in the laser cavity.

28. The semiconductor laser of claim 27 wherein said saturable absorber layer is located from 0.05 to 0.2 µm from said active region, separated therefrom by a higher bandgap cladding layer.

29. The semiconductor laser of claim 27 wherein a ridge layer is disposed on said saturable absorber layer in a central stripe extending the length of the laser cavity, said ridge layer having a higher bandgap energy than said saturable absorber layer for transversely confining absorption generated carriers thereto, lower bandgap material being disposed on said saturable absorber layer on both sides of said central ridge layer, allowing said absorption generated carriers to leave said saturable absorber layer into said lower bandgap material after diffusing laterally within said saturable absorber layer.

30. A semiconductor laser, comprising:

a semiconductor heterostructure including a multi-quantum-well (MQW) active region, upper and lower cladding layers bounding said active region, a saturable absorber layer disposed over said upper cladding layer and positioned sufficiently close to said active region to overlap the optical spatial mode of light generated by said active region, a ridge layer formed as a central stripe extending the length of said active region and disposed over said saturable absorber layer, said saturable absorber layer having an effective bandgap energy less than that of said active region, upper cladding layer and ridge layer, and a lower bandgap material layer disposed over said saturable absorber layer on both sides of said ridge layer, excitation means for pumping said active region in a central stripe area beneath said ridge layer, and optical feedback means defining a resonant laser cavity containing said active region, said active region includes a plurality of very thin quantum wells each having a thickness of at most 5 nm and bounded and separated by quantum barriers, the quantum wells being composed of material substantially lattice matching said cladding layers, the quantum wells characterized by a bandgap energy, $E_{photon}$, with associated total carrier confinement energy, and $E_e$ and $E_h$, that are at least 0.05 eV higher than an intrinsic material bandgap energy, $E_g$, of said quantum wells, the quantum barriers having a higher effective bandgap energy than said quantum wells and sufficient thickness of at least 2 nm to confine carriers within said quantum wells, the combination of said quantum wells being compressively strained and having a thickness of at most 5 nm permitting attainment of TE polarization mode emission for wavelengths lest than 650 nm, said saturable absorber layer in said heterostructure providing self-pulsating operation of the laser.

* * * * *